United States Patent
He et al.

(10) Patent No.: US 7,679,145 B2
(45) Date of Patent: Mar. 16, 2010

(54) TRANSISTOR PERFORMANCE ENHANCEMENT USING ENGINEERED STRAINS

(75) Inventors: Jun He, Portland, OR (US); Zhiyong Ma, Portland, OR (US); Jose A. Maiz, Portland, OR (US); Mark Bohr, Aloha, OR (US); Martin D. Giles, Portland, OR (US); Guanghai Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1095 days.

(21) Appl. No.: 10/930,247

(22) Filed: Aug. 31, 2004

(65) Prior Publication Data

US 2006/0043579 A1 Mar. 2, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 23/495* (2006.01)
*H01L 23/34* (2006.01)

(52) U.S. Cl. ............ 257/401; 257/669; 257/675; 257/712; 257/713; 257/717; 257/718; 257/719; 257/722; 257/E23.08; 257/E23.11; 257/E29.001; 257/E29.07; 257/E29.071

(58) Field of Classification Search ............ 257/401, 257/675, 712–713, 717–719, 722, 669, E23.08, 257/E23.11, E29.001, E29.07, E29.071
See application file for complete search history.

(56) References Cited

U.S. PATENT DOCUMENTS

| | | | | |
|---|---|---|---|---|
| 3,553,820 | A | * | 1/1971 | Sara ............ 164/108 |
| 5,186,785 | A | * | 2/1993 | Annamalai ............ 428/446 |
| 5,376,815 | A | * | 12/1994 | Yokota et al. ............ 257/341 |
| 5,483,740 | A | * | 1/1996 | Maslakow ............ 29/827 |
| 5,585,671 | A | * | 12/1996 | Nagesh et al. ............ 257/697 |
| 6,056,186 | A | * | 5/2000 | Dickson et al. ............ 228/122.1 |
| 6,292,367 | B1 | * | 9/2001 | Sikka et al. ............ 361/705 |
| 6,365,978 | B1 | * | 4/2002 | Ibnabdeljalil et al. ............ 257/786 |
| 6,596,139 | B2 | * | 7/2003 | Scott et al. ............ 204/298.12 |
| 6,770,513 | B1 | * | 8/2004 | Vikram et al. ............ 438/122 |
| 6,807,345 | B2 | * | 10/2004 | Simon ............ 385/49 |
| 6,828,211 | B2 | * | 12/2004 | Chi ............ 438/424 |
| 6,847,106 | B1 | * | 1/2005 | Howard et al. ............ 257/687 |
| 6,888,238 | B1 | * | 5/2005 | Li ............ 257/706 |
| 6,921,982 | B2 | * | 7/2005 | Joshi et al. ............ 257/349 |
| 6,934,154 | B2 | * | 8/2005 | Prasher et al. ............ 361/699 |
| 6,940,705 | B2 | * | 9/2005 | Yeo et al. ............ 361/302 |
| 7,052,741 | B2 | * | 5/2006 | Medeiros et al. ............ 427/464 |

(Continued)

FOREIGN PATENT DOCUMENTS

EP 937744 A1 * 8/1999

(Continued)

*Primary Examiner*—Ida M Soward
(74) *Attorney, Agent, or Firm*—Blakely, Sokoloff, Taylor & Zafman LLP

(57) ABSTRACT

A semiconductor substrate having metal oxide semiconductor (MOS) devices, such as an integrated circuit die, is mechanically coupled to a stress structure to apply a stress that improves the performance of at least a portion of the MOS devices on the die.

21 Claims, 3 Drawing Sheets

U.S. PATENT DOCUMENTS

| | | |
|---|---|---|
| 7,081,669 B2 * | 7/2006 | Fitzgerald et al. ............ 257/707 |
| 7,084,061 B2 * | 8/2006 | Sun et al. .................... 438/685 |
| 7,089,032 B2 * | 8/2006 | Hongo et al. ............ 455/550.1 |
| 7,279,746 B2 * | 10/2007 | Doris et al. ................. 257/338 |
| 7,394,665 B2 * | 7/2008 | Hamasaki et al. ........... 361/803 |
| 2002/0012609 A1 * | 1/2002 | Ewer .......................... 420/570 |
| 2002/0048153 A1 * | 4/2002 | Seshan ....................... 361/704 |
| 2003/0128521 A1 * | 7/2003 | Matayabas et al. .......... 361/705 |
| 2004/0063300 A1 * | 4/2004 | Chi ............................. 438/425 |
| 2004/0195624 A1 * | 10/2004 | Liu et al. .................... 257/347 |
| 2004/0245965 A1 * | 12/2004 | Zhang et al. ................ 323/220 |
| 2005/0070048 A1 * | 3/2005 | Tolchinsky et al. .......... 438/108 |
| 2005/0093105 A1 * | 5/2005 | Yang et al. .................. 257/627 |
| 2005/0116387 A1 * | 6/2005 | Davison et al. ............. 264/293 |
| 2005/0121775 A1 * | 6/2005 | Fitzgerald et al. ............ 257/707 |
| 2005/0139929 A1 * | 6/2005 | Rost ............................ 257/369 |
| 2005/0145941 A1 * | 7/2005 | Bedell et al. ................. 257/348 |
| 2005/0224800 A1 * | 10/2005 | Lindert et al. .................. 257/66 |
| 2005/0255304 A1 * | 11/2005 | Brink ......................... 428/209 |
| 2005/0280140 A1 * | 12/2005 | Corbin et al. ............... 257/706 |
| 2006/0003580 A1 * | 1/2006 | Goh et al. .................... 438/652 |
| 2006/0033095 A1 * | 2/2006 | Doyle et al. ................... 257/19 |
| 2006/0226521 A1 * | 10/2006 | Coyle et al. ................. 257/666 |
| 2006/0268384 A1 * | 11/2006 | Desai et al. ................. 359/224 |

FOREIGN PATENT DOCUMENTS

JP    2003243579 A  *  8/2003

* cited by examiner though the impact on NMOS devices is much less than the impact on PMOS devices. Since the performance trends with applied stresses are quite different and often opposite between NMOS and PMOS, any MOS improvements through stress engineering need to strike a fine balance between NMOS and PMOS.

TRANSISTOR PERFORMANCE ENHANCEMENT USING ENGINEERED STRAINS

BACKGROUND

1. Field

Embodiments of the invention apply to semiconductor device manufacture and, more particularly, to applying stresses to semiconductor substrates to enhance transistor performance.

2. Background

Metal Oxide Semiconductor (MOS) technology has become the overwhelming choice or electronic devices from DVD (Digital Video Disk) players to portable telephones to computers. MOS technology is primarily used to form devices such as transistors and diodes in silicon chips. Electronic circuits normally require devices that have a positive channel (PMOS) together with devices that have a negative channel (NMOS). The characteristics of PMOS and NMOS devices differ, however. For example, the performance of MOS devices can be improved by applying stresses to the MOS devices. However, PMOS and NMOS devices respond differently to these stresses.

The performance of PMOS devices can be improved by applying compression along the direction of the current flow and by applying tension across the direction of current flow. Compression along the direction of current flow (along the channel) degrades NMOS performance. By contrast, the performance of NMOS devices can be improved by applying tension along the direction of the current flow, and by applying tension across the direction of current flow. Also the impact on NMOS devices is much less than the impact on PMOS devices. Since the performance trends with applied stresses are quite different and often opposite between NMOS and PMOS, any MOS improvements through stress engineering need to strike a fine balance between NMOS and PMOS.

There are several approaches to applying uniaxial strains to particular devices in MOS circuitry. In the fabrication of NMOS circuits, the stress properties of a nitride film, such as $Si_3N_4$ contact NESL (Nitride Etch Stop Layer), have been used to influence the performance of the NMOS transistors by straining the silicon in the transistor channel. The nitride film is designed to apply appropriate stresses to individual NMOS devices to optimize the performance of each device. A tensile NESL enhances NMOS performance and has a modest impact on PMOS devices.

Silicon Germanium source and drain structures have also been used to introduce a compressive strain to PMOS structures. This enhances the PMOS performance without any impact on NMOS performance. The fabrication of stressed NESL films or specialized source and drain structures adds to the complexity and expense of the circuitry. In addition, as devices are made smaller the reduced size of the stress sources may weaken their effect. As a result, the performance benefits may be reduced or lost.

A silicon film can be grown on top of a silicon-germanium relaxed substrate to apply a stress to the silicon film. The silicon film can be used as an otherwise conventional silicon substrate for a semiconductor chip. The silicon-germanium substrate applies a biaxial tensile stress to the silicon film with the stress penetrating the film to a depth on the order of a few hundred to a few thousand angstroms. Such an approach has not been commercially adopted due to cost, process complexity, and integration challenges associated with this technique.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Figure 1:
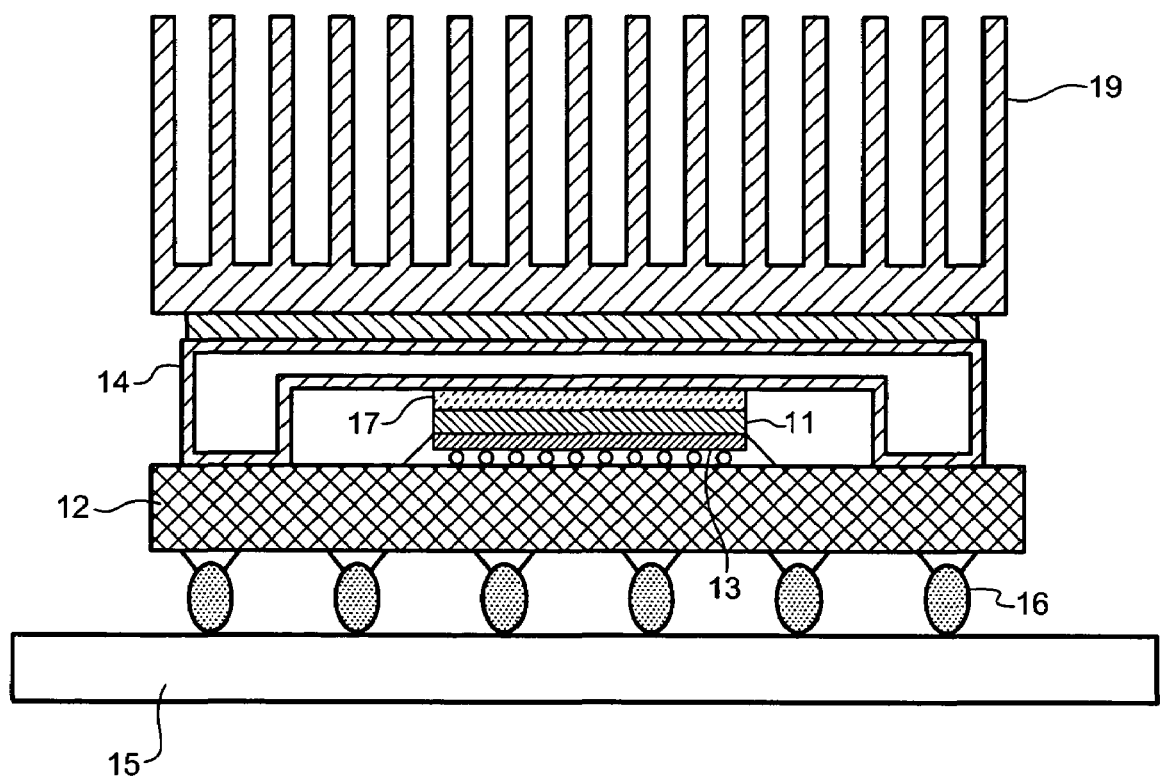
FIG. 1 is a cross-sectional diagram of a semiconductor package suitable for applying embodiments of the present invention.

FIG. 1 is a cross-sectional diagram of an IC (Integrated Circuit) package coupled to a PCB (Printed Circuit Board). The package has an IC, die, or chip 11 attached to a package substrate 12. The IC may be any of a variety of different types including a microprocessor, microcontroller, ASIC (Application Specific Integrated Circuit), FPGA (Field Programmable Gate Array), DSP (Digital Signal Processor), memory, I/O (Input/Output) controller or hub, etc. The substrate has data, control, and power interfaces 13 to the chip coupled to ground, power and signaling planes within the substrate. The substrate may be formed from any rigid dielectric substrate, such as a standard PC (printed circuit) board material, for example, FR-4 epoxy-glass, polyimide-glass, benzocyclobutene, Teflon, other epoxy resins, injection molded plastic or the like or ceramic. In one embodiment, the substrate is about 40 mils (1.0 mm) thick although it may be thicker or thinner, in other embodiments. The die is coupled to the substrate using a set of connectors 13, such as C4 (Controlled Collapse Chip Connect) bumps or any other type of electrical connection system.

The package includes a cover 14 to seal the die and protect it from the external environment. The cover may be hermetically sealed to the substrate. In one embodiment, the cover is an IHS (Integrated Heat Spreader) thermally coupled to the die to transfer heat from the die to the package exterior. The IHS is thermally coupled using a TIM (Thermal Interface Material) 17 such as a solder or thermal grease. However, other types of covers may also be used.

The package substrate 12 is coupled to a second substrate 15 which may be a socket, motherboard, a daughtercard, a cartridge substrate, a flexboard or any other substrate which may carry the package. In one embodiment, the second substrate is a conventional PCB, PWB (Printed Wiring Board) or a socket mounted to such a board. The land side of the package substrate is mounted to the second substrate using a set of connectors 16. These connectors may include power, ground and signaling connectors or a subset of such connectors. The connectors may be implemented using any of a variety of different technologies including BGA (ball grid array), SMT (Surface Mount Technology), LGA (Land Grid Array) or any of a variety of solder reflow technologies.

As can be seen in FIG. 1, the package substrate 12 couples the die 11 through the package substrate to the socket 15. Vias through the package substrate connect the various package substrate planes for ground, power and signaling to the socket.

The example of FIG. 1 also includes a heat sink 19 thermally coupled to the package cover or IHS using, for example a TIM (Thermal Interface Material) or a spring connector. The heat sink has a set of pins or fins to present a large surface area to the ambient outside the package. The heat sink may be augmented by a fan or some other cooler. Alternatively, any of a variety of other cooling devices may be used, including heat pipes, liquid coolers, etc.

Figure 2:
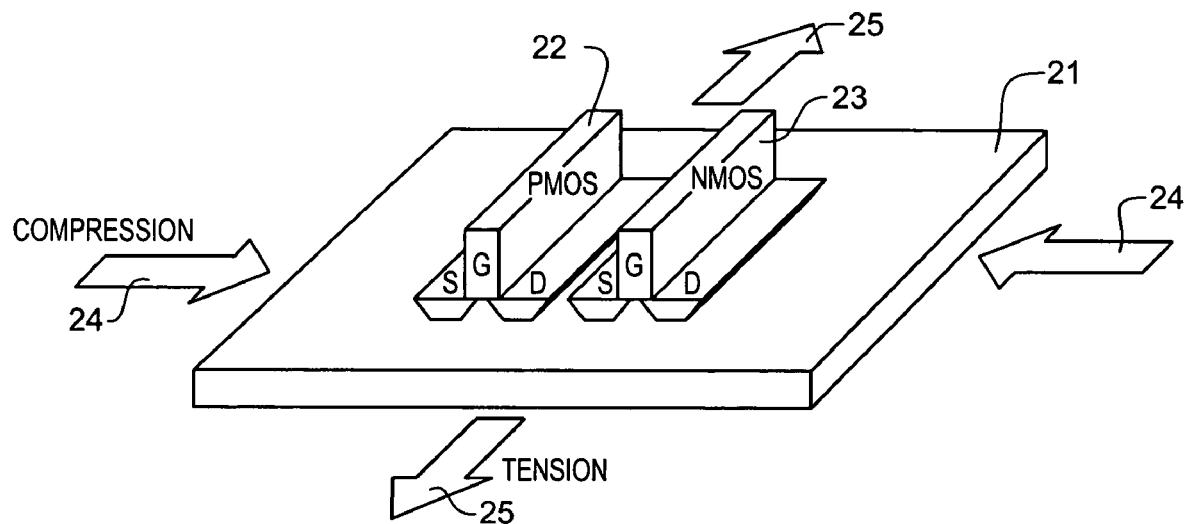
FIG. 2 is a perspective diagram of stresses that might be applied to PMOS and NMOS transistors on a die according to an embodiment of the present invention.

In one embodiment, the die includes MOS structures as shown in the diagram of FIG. 2. In FIG. 2, a die 21 carries a PMOS transistor 22 and an NMOS transistor 23. Both transistors include a source (S), a drain (D) and a gate (G) connecting the source and drain. Current flows through the transistor from the source to the drain under the gate. In the diagram of FIG. 2, current flows from left to right across the page. FIG. 2 is a simplified diagram for explanation purposes only, a typical die will contain thousands or millions of transistors and many other components and layers not shown in FIG. 2.

FIG. 2 also shows an anisotropic strain applied to the die, that is a strain that is different in different directions. The strain may be generated in many different way as described in more detail below. A strain may be optimized by aligning it relative to the direction of current flow in the MOS structures. For the MOS structures, one strain may be a compression along the direction of current flow as shown by the compression arrows 24 in FIG. 2. Another strain may be a tension along the direction perpendicular to MOS current flow as shown by the tension arrows 25 in FIG. 2.

Either or both of these strains may be used to advantage in semiconductor systems containing PMOS structures. The strain increase the hole mobility and accordingly, increase the PMOS drive current. This improves efficiency, and speed and reduces heating in the die. Such anisotropic strains may be used to significantly improve PMOS performance with only a small reduction in NMOS performance. In addition the strains may be combined with any other stress technologies to further enhance performance. For example, the strains shown in FIG. 2, may be combined with local strains built into the structure of the die that act only on specific transistors.

Figure 4:
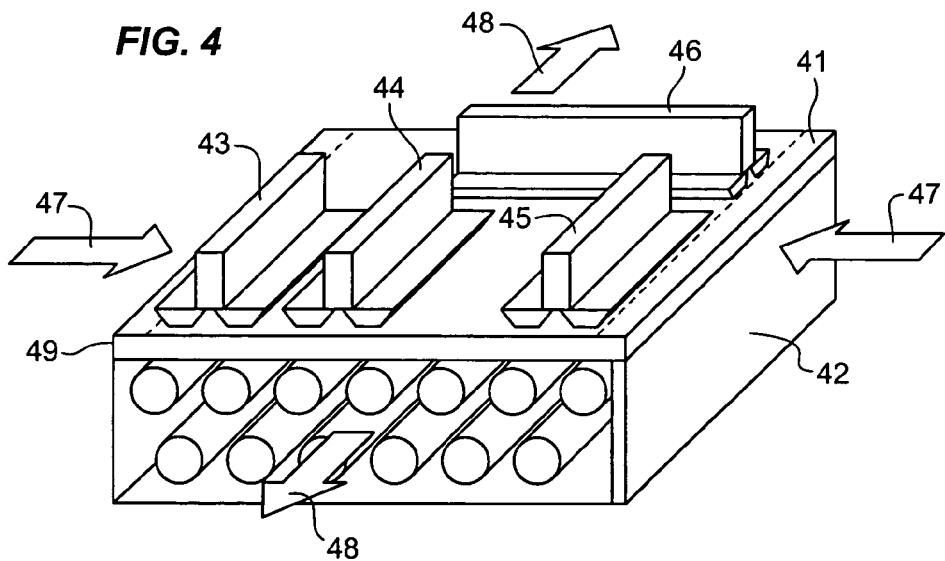
FIG. 4 is a perspective diagram of a stressed die according to an embodiment of the present invention.

The NMOS transistor will perform better if it is rotated ninety degrees as shown by the NMOS transistor 46 of FIG. 4. NMOS transistors perform better with a tension applied in the direction of current flow. The low sensitivity of an NMOS transistor to a compressive stress applied perpendicular to the current flow minimizes the negative performance impact of the uniaxial compression shown in FIG. 2. Because applied stresses have a larger effect on PMOS structures than on NMOS structures, the present description will emphasize applying stresses to PMOS structures. The corresponding reduction in NMOS performance may be mitigated by applying stresses on individual NMOS devices in the die, by rotating the NMOS structures as shown in FIG. 4, by minimizing the number of NMOS devices, or by placing NMOS devices in portions of the die which have less stress.

The strains diagrammed in FIG. 2 may be applied in many different ways. In laboratory tests, clamps, vises and other mechanical devices are used so that the amount of and direction of stress can be adjusted and measured. However, such large and complex laboratory test equipment is not practical for commercial sale and marketing.

One way to apply a stress to a die is to use materials that have a different coefficient of thermal expansion (CTE) than the die. A typical silicon die has a CTE of about 3 ppm/K at the temperature range of interest. The CTE for dies made of other materials, such as gallium arsenide, lithium niobate, or other materials may vary. Copper and aluminum, on the other hand have CTEs of 17 ppm/K and 25 ppm/K, respectively. If the die is mechanically coupled in some way to copper or aluminum at a high temperature, then as the two materials cool, the metal part will shrink more than the die. Depending on how the two are attached, at the cooler temperature, the metal can be used to exert a compressive force on the die.

CVD (Chemical Vapor Deposition) diamond on the other hand has a CTE of about 1 ppm/K and carbon fiber has a CTE of about −1.4 ppm/K long the fiber axial direction. Another example is Invar alloys with CTE nearly zero over a broad temperature range. By attaching CVD diamond, carbon fiber or Invar alloys to the die at a high temperature, a tensile force can be exerted on the die as the two materials reach room temperature or product operating temperature.

In one embodiment, a tension may be applied by attaching a conventional aluminum or copper integrated heat spreader (shown in FIG. 1) to the die at a high temperature using a special high temperature high bonding solder. Such a solder is applied at a temperature at or above solder melting temperature which ranges from 180 to 400° C. While the typical operating temperature of, for example a microprocessor, is closer to 100° C. Many other integrated circuit dies operate at much lower temperatures. An integrated heat spreader has a much higher coefficient of thermal expansion than a silicon die substrate. As the metal heat spreader and die cool, the heat spreader will shrink more than the die and will exert a compressive strain on the die. The metal heat spreader exerts a compressive force that is coupled mechanically to the die through the solder.

The strain on the die using a standard heat spreader will be isotropic because a standard metal heat spreader is made from a single piece of uniform metal material. This material will shrink the same amount in all directions. The thermal nature of conventional copper and aluminum heat spreaders is isotropic. In order to direct the strain along a particular axis, as shown in FIG. 2, the geometry of the die and heat spreader may be designed specifically for that purpose.

If the operating temperature of the die is lower than the soldering temperature, then the strain from the heat spreader will be exerted as long as the solder bond holds. The solder normally used to attach heat spreaders are lower temperature solders that allow for creep. In other words, the heat spreader and die can slowly move with respect to each other. The creep relaxes any stress between the heat spreader and the die so that after a few months there is no applied stress. The creep in the solder allows the die to more easily endure temperature changes without cracking, but it does not allow for any stress to be designed into the combination. By using a high temperature solder with little or no creep, the strain can be maintained over a long period of time. While this puts stress on the die, if the CTEs of the two materials and the temperatures are carefully chosen, then the amount of stress can be selected to increase performance without reducing reliability.

A conventional IHS is thermally isotropic so it will apply the same compressive stress in all directions. In order to apply a stress along only one particular direction, the heat spreader may be designed using a specialized material, for example uni-directional fiber composites as described below. The composite may be used in place of the integrated heat-spreader (IHS) 14 of FIG. 1 or even replacing the heat sink 19. If the fiber composite is designed with thermal properties similar to a copper IHS, then the IHS will be able to conduct heat away from the die just as well as a conventional copper IHS. The die and IHS combination may also be designed to minimize any areas of non-uniform stress. One such area is the edge of the die (41 in FIG. 4). This reduces variations in the stress within the die.

Figure 3:
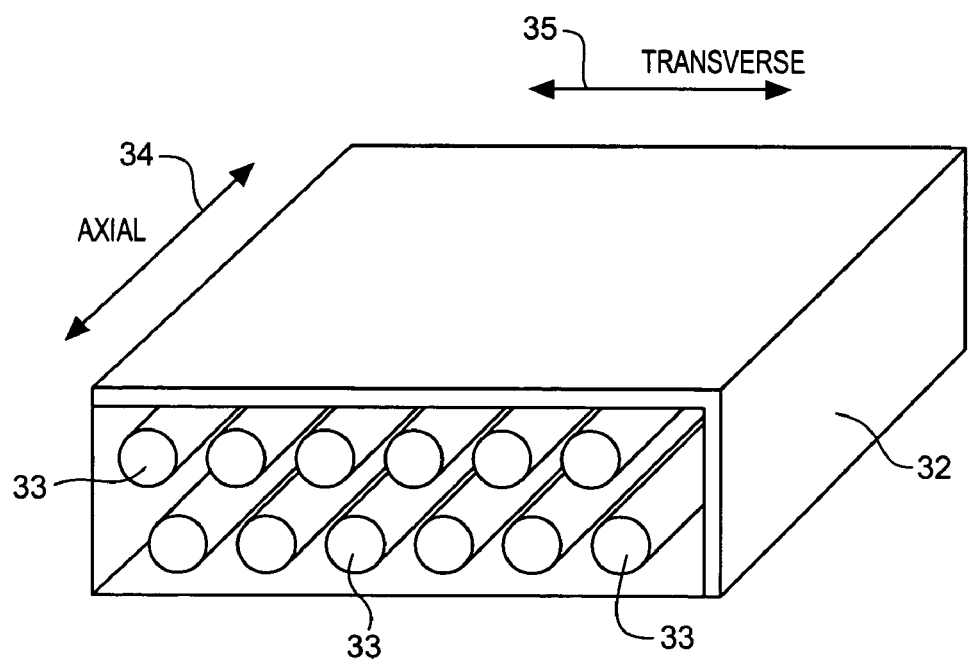
FIG. 3 is a perspective diagram of an anisotropic metal matrix composite material suitable for use with embodiments of the present invention.

One such specialized composite material is an aluminum or copper matrix 32 with embedded carbon fiber stringers 33 as shown in FIG. 3. The metal matrix provides superb thermal conductivity and the thermally conductive carbon fibers embedded in the metal matrix have a very low coefficient of thermal expansion (CTE) along their axes. In one example, the fibers have an axial CTE of about −1.4 ppm/K. As a result, a composite with a fiber volume fraction of more than about 30-35% can have a CTE less than the silicon die along the axes 34 of the fibers and a CTE higher than the silicon die along a transverse direction 35 to the axes of the fibers.

Because carbon fibers are also thermally conductive, the thermal conductivity of an aluminum-based composite is comparable to solid copper and better than solid aluminum. This allows the metal matrix composite material to also function effectively as an integrated heat spreader or heat sink. Additional thermal pastes, solders, or adhesives may be used to maintain the thermal path from the die.

The composite material shown in FIG. 3 creates anisotropic in-plane strains in a semiconductor die when the two are attached at elevated temperatures. The composite has anisotropic thermal expansion coefficients, less than the die along one in-plane direction and greatly exceeding the die along the perpendicular in-plane direction. The material can also be used as a heat spreader. The process for making materials such as that described with respect to FIG. 3 are commercially available. While a metal matrix with embedded carbon fiber is described as an example, there are a great variety of different materials that may be available or developed with desirable anisotropic thermal properties. Any materials with CTE lower or comparable to that of silicon such as CVD diamond, SiC or $B_4C$, can be used in combination with metal. Higher temperature polymers and certain high CTE ceramics (such as $Al_2O_3$ or $Zr_2O_3$) can also be used to create a composite with a desirable anisotropic CTEs.

To attach the composite heat spreader and ensure large anisotropic in-plane stresses, solders with high melting temperatures and very low creep rates may be used. Alternatively, other types of connection technologies may be used. High melting point solders include eutectic AuSn, AuSi and AuGe. In a silicon die attached to a copper substrate, a combined bi-axial stress of 1350 MPa has been measured. This measurement was based on a 200 μm thick silicon substrate attached to copper using AuSn which translates into 800 MPa stresses at 120° C. Therefore 400 MPa transverse compression and 0-60 MPa axial tension are expected at 120° C. with AuSn solder using the composite IHS described above. Even higher stresses may be expected when AuSi or AuGe solder is used due to the higher melting temperature.

The beneficial effect of the applied stress may not be uniform across the die. Due to a free edge effect, even when the composite material is attached to an entire surface of a die, the stress level will be lower at the edges of the die. For AuSn solder, the edge zone may be about 5 times the die thickness for a 400 MPa peak stress. In other words, for a typical 0.75 mm thick die, any MOS devices within 4 mm of the edge of the die will experience significantly less stress, and significantly different performance than devices at the center of the die. The edge zone may be reduced by using a thinner die or a more secure solder connection. If the die is reduced to a 50 micron thickness, then devices located within 0.25 mm of the two die edges (edge exclusion zone, 41 in FIG. 4) along the axial direction will not be under the maximum compressive strain. A thinner die also is less likely to crack due to the strains applied by the stress layer.

In order to accommodate the free edge effect, the circuitry on the die may be designed so that the circuits at the edge of the die are those for which speed is less important, for example cache memory. The die may be arranged so that the circuits for which speed is most critical, for example execution cores, are placed away from the edges of the die.

The benefits of the applied stress layer can be increased by designing the MOS devices in the circuit to line up with the applied stresses. As stated above with reference to FIG. 2, a compressive stress along the axis of current flow will improve the performance of a PMOS device but degrade the performance of an NMOS device.

Referring to FIG. 4, a die with a silicon substrate 49 and various MOS structures has been attached to a stress structure 42, in this example a metal matrix composite material. The stress structure is soldered to the die using a high temperature solder such as AuSi and allowed to cool to an operating temperature. The die in the diagram of FIG. 4 has two pairs of MOS structures. The first pair is similar to that of FIG. 2 and has a PMOS transistor 43 and an NMOS transistor 44 parallel to each other and aligned so that current flows parallel to the compressive strain 47 and perpendicular to the tensile strain 48. With this configuration, in one example, based on the 400 MPa compressive stress 47 alone, the linear drive current (Idlin) for PMOS increases by 23% and the saturation drive current (Idsat) increases by 16%. For NMOS devices, in this example, Idlin and Idsat degrade by 5% and 7%, respectively.

The second pair of NMOS structures has a PMOS transistor 45 aligned like the transistors in the first group but the NMOS transistor is now aligned perpendicular to the PMOS transistor so that the current flow through the NMOS transistor is transverse to the compressive stress. The NMOS degradation with this alignment is reduced to 3.5% and 2% for Idlin and Idsat, respectively. Accordingly, by aligning the devices performance can be increased. Negative impacts from compressive strain 47 on NMOS can be further reduced by strategically locating critical NMOS in the edge exclusion zone since the magnitude of strain 47 is significantly less due to the free edge effect.

If the axial tensile stress 48 is also considered, then further PMOS improvement may be achieved depending on the magnitude of tensile stress. NMOS performance may also be improved if the NMOS devices are aligned with the tensile stress as in the second pair 46. For any implementation, the effects of the mechanical stress may be moderated or adjusted to reduce the risk of cracking the die.

As an alternative to the composite material described above, a stress may also be applied using coatings formed on the die. Such coatings are mechanically coupled directly to the die through their own molecular structures. In one embodiment a diamond coating is applied by chemical vapor deposition on a surface of the die. Chemical vapor deposition processes are typically performed at very high temperatures. When the coated die returns to room temperature or an operating temperature, the diamond coating with a lower coefficient of thermal expansion applies a tensile stress to the die. Any of a variety of other low CTE materials can be coated on the die instead of diamond. Other coating processes other than CVD may also be used. Alternatively, a metal coating may be deposited to produce a compressive stress to the coated surface of the die. This coating may be applied to any surface of the die or to more than one surface in order to create combined effects. If the coating is thermally conductive, then a conventional or anisotropic IHS may be soldered or otherwise attached to the die over the coating.

The coating may also be designed to produce an anisotropic result strain. This can be done by selecting materials that have anisotropic CTEs or by applying coatings in a way that creates an anisotropic effect. As mentioned above, there are a variety of composite materials which have one CTE in one direction and another CTE in another direction. Some monolithic materials also have an anisotropic CTE and can be used to apply an anisotropic stress. Some such materials include $Al_2TiO_5$, $Fe_2TiO_5$, $MgTi_2O_5$, and similar oxides as well as hydrocarbons and other planar molecular crystals. These materials exhibit a very low or even negative CTE in one direction and a higher CTE in the perpendicular direction or vice versa.

Figure 5:
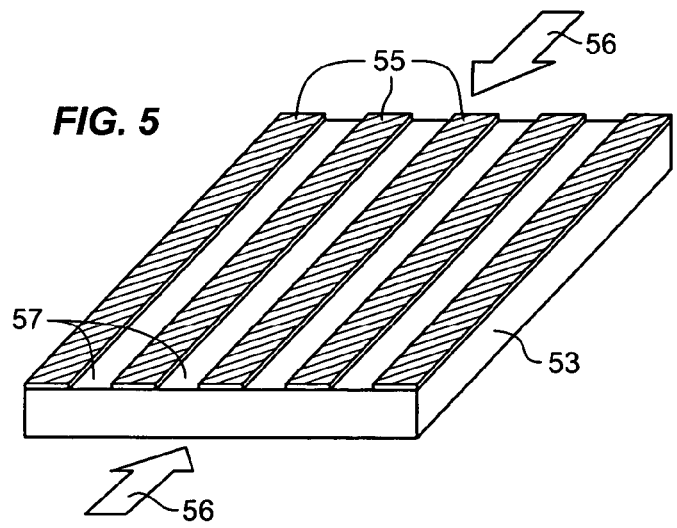
FIG. 5 is a perspective diagram of a coated metal pattern with anisotropic properties suitable for use with embodiments of the present invention.

FIG. 5 shows a pattern of material that can be used to obtain an anisotropic effect with an isotropic material. A die 53 may be an integrated circuit of any kind with dozens or millions of MOS devices. A copper layer 55 has been applied to a surface of the die. This can be the same as or a different surface from the surface to which an IHS is attached. The copper layer may be applied by sputtering, deposition or in any of a variety of other ways that mechanically couple the copper layer to the substrate. The copper layer is applied in long stripes or bars. In the illustrated example the bars extend along the entire length of the surface of the die and the bars are aligned along the same axis so that they are roughly parallel to each other. There is a gap 57 between each bar at which the die is not coated with copper.

As the die cools, after the coating is applied, each bar will apply a compressive tension to the die along its length as shown by arrows 56. Since the bars cover roughly the entire length of the die, this compressive strain will be fairly uniform across the entire length of the die. In the perpendicular direction, the bars are unable to exert any significant strain on the die because of the gaps. The die absorbs the strain where the bars are and relaxes it between the bars. Due to the free edge effect discussed above, the bars can be as wide as 0.5 mm on a 0.050 mm thick die without applying any significant strain in the perpendicular direction across the gaps. The striped pattern with features of this size can be accomplished using a screen or using photolithography and etching.

Similar effects to the copper bars can be achieved with aluminum and other materials that have high CTE values. Alternatively, low CTE materials may be used and applied with a particular pattern to create a tensile strain. The particular material and pattern geometry (width of bar and gap, film thickness, etc.) may be selected based on the desired effect. By using a material that also has a high thermal conductivity, the patterned layer can be used as the interface to which the IHS is attached.

Figure 6:
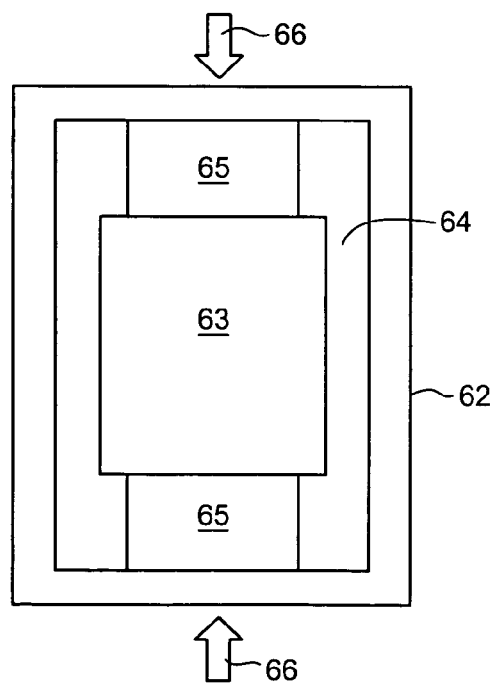
FIG. 6 is a top view diagram of a package with structures to stress an enclosed die according to an embodiment of the present invention.

Another way to apply a strain to a die is to place the die in a receptacle or housing that stresses the die or applies a mechanical tension to the die. A die is typically mounted to an external package 14, 12 for commercial use and this package may be used to apply strains in one or more directions. Alternatively, a strain producing mechanism or structure may be included in the package. FIG. 6 shows an example of a package 62 that has been adapted to apply a compressive strain to a die 63 as shown by arrows 66. The interior 64 of the package features two compression blocks 65 one on either side of the die and made of a material with a lower CTE than the die, such as a ceramic. The compression blocks may be made out of the same or a different material from the rest of the package and may be separate pieces or a single piece with the package. Other stresses with materials with different CTE. Additional strain blocks can be placed in other locations within the package to produce strains in the same or other directions. The strain engineering can be done by selecting the CTE of the package as well as of the die and the strain blocks.

The package and the die are both brought to a very high temperature and the die is inserted into the package so that it touches or almost touches the two compression blocks. As the assembly cools, the package and die are reduced in size. The compression blocks shrink less and accordingly press against opposing sides of the die to produce a compressive strain. At the operating temperature, even without solder, glue or coatings, the compression blocks are coupled mechanically to the die by their relative size. The CTE of the die, the package and the compression blocks may be adjusted together with the relative assembly temperatures to produce precisely the desired strain.

The particular configurations, materials and processes shown are provided as examples of embodiments of the present invention. Individual transistors are shown for illustration purposes, while embodiments of the invention may be applied to systems with hundreds, thousands or millions of transistors and other devices. Embodiments of the present invention may be applied to many different chips or dies and in many different configurations. Embodiments of the present invention may be applied to create transistor level stressing and combined with existing transistor level stressing technologies to reduce or increase stresses on individual transistors or groups.

Dies stressed according to different embodiments of the present invention may be used for a wide range of different circuits. An application of embodiments of the present invention is in stressing dies for use in VLSI (Very Large Scale Integrated Circuits) that may be used in controllers, processors, hubs, DSPs (Digital Signal Processors), ASICs (Application Specific Integrated Circuit), memories and many other devices.

It is to be appreciated that a lesser or more complex semiconductor device, integrated circuit, or package than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art will recognize that the invention is not limited to the embodiments described, but may be practiced with modification and alteration within the spirit and scope of the appended claims. The description is thus to be regarded as illustrative instead of limiting.

What is claimed is:

1. An apparatus comprising
a die having a semiconductor substrate and metal oxide semiconductor (MOS) devices;
a metal matrix stress structure with uniaxial carbon fibers mechanically coupled to the substrate and aligned with respect to the substrate so that under thermal expansion, the carbon fibers apply a uniaxial stress that improves the performance of at least a portion of the MOS devices.

2. The apparatus of claim 1, wherein the stress structure comprises a metal heat spreader thermally coupled to the substrate.

3. The apparatus of claim 1, wherein the stress structure comprises a metal plate soldered to the substrate.

4. The apparatus of claim 1, wherein the stress structure comprises an integrated heat spreader.

5. The apparatus of claim 1, wherein the stress structure comprise a film that is applied to a surface of the substrate.

6. The apparatus of claim 5, wherein the film is applied by chemical vapor deposition.

7. The apparatus of claim 5, wherein the film comprises a chemical vapor deposition diamond film.

8. An apparatus comprising:
a semiconductor die comprising metal oxide semiconductor (MOS) devices;
a heat spreader having a first coefficient of thermal expansion in one direction and a second different coefficient of thermal expansion in a second perpendicular direction, so that when coupled to the die the heat spreader applies a different stress to the die in the first direction than in the second direction; and
a heat sink coupled to the heat spreader.

9. The apparatus of claim 8, wherein the heat spreader applies a compressive stress to the die in the first direction at the operational temperature.

10. The apparatus of claim 8, wherein the heat spreader has a second coefficient of thermal expansion in the second perpendicular direction, that is greater than the coefficient of thermal expansion of the die.

11. The apparatus of claim 8, wherein the second coefficient of thermal expansion is lower than the coefficient of thermal expansion of the die, so that the heat spreader applies a tensile stress in the second direction at the operating temperature.

12. The apparatus of claim 8, wherein the heat spreader comprises a metal matrix with uniaxial carbon fibers.

13. The apparatus of claim 8, wherein the coefficient of thermal expansion of the heat spreader is selected to result in a determined stress on the die at an operating temperature of the die, the apparatus further comprising
a solder to couple the heat spreader to the die at a temperature higher then the operating temperature of the die, the solder forming a mechanical bond that does not creep at operating and ambient temperatures.

14. An apparatus comprising:
a die;
a stress structure mechanically coupled to the die at a first temperature, the stress structure having a coefficient of thermal expansion different from the die;
wherein the die and coupled stress structure are maintained at a second lower temperature, so that the stress structure applies a stress to the die at the second temperature through the mechanical coupling.

15. The apparatus of claim 14, wherein the stress structure comprises a metal heat spreader and wherein the mechanically coupling comprises a solder connection between the heat spreader and the die.

16. The apparatus of claim 14, wherein the stress structure comprises a coating and wherein the mechanically coupling comprises a coating deposited on the die.

17. The apparatus of claim 14, wherein the second temperature comprises an operating temperature of the die.

18. A computer system comprising:
a motherboard; and
a processor coupled to the motherboard, the processor having a die including a semiconductor substrate and metal oxide semiconductor (MOS) devices and a stress structure mechanically coupled to the substrate and aligned with respect to the substrate so that under thermal expansion, the stress structure applies a stress in one direction with respect to the substrate through the mechanical coupling that improves the performance of at least a portion of the MOS devices.

19. The computer system of claim 18 wherein the processor is coupled to the motherboard using a socket.

20. The computer system of claim 18, wherein the stress structure comprises a material having a coefficient of thermal expansion different from the coefficient of thermal expansion of the substrate so that the stress structure applies a stress to the substrate at an operating temperature.

21. The system of claim 20, wherein the stress structure comprises a metal matrix with uniaxial carbon fibers.

* * * * *